United States Patent [19]

Fefferman

[11] Patent Number: 4,459,320
[45] Date of Patent: Jul. 10, 1984

[54] MASKLESS PROCESS FOR APPLYING A PATTERNED SOLDER MASK COATING

[75] Inventor: Gerald B. Fefferman, Parsippany-Troy Hills, N.J.

[73] Assignee: AT&T Bell Laboratories, Murray Hill, N.J.

[21] Appl. No.: 449,481

[22] Filed: Dec. 13, 1982

Related U.S. Application Data

[63] Continuation of Ser. No. 329,867, Dec. 11, 1981, abandoned.

[51] Int. Cl.$^3$ .......................... B05D 3/06; B05D 5/12
[52] U.S. Cl. ..................................... 427/44; 427/43.1; 427/54.1; 427/97; 427/273; 427/335; 427/375; 427/379; 427/393.5; 427/96; 427/420; 427/421; 427/428
[58] Field of Search .................. 427/35, 36, 44, 54.1, 427/43.1, 96, 97, 271, 273, 335, 375, 379, 407.1, 393.5, 386, 420, 421, 428; 228/118

[56] References Cited

U.S. PATENT DOCUMENTS

| | | | |
|---|---|---|---|
| 2,965,952 | 12/1960 | Gillett et al. | 29/155.55 |
| 3,573,975 | 4/1971 | Ohaka et al. | 427/96 |
| 3,850,675 | 11/1974 | Miller | 427/54.1 |
| 4,017,968 | 4/1977 | Weglin | 29/625 |
| 4,022,932 | 5/1977 | Feng | 427/93 |
| 4,136,225 | 1/1979 | Feit et al. | 428/201 |
| 4,230,793 | 10/1980 | Losert et al. | 430/315 |
| 4,234,626 | 11/1980 | Peiffer | 427/96 |

FOREIGN PATENT DOCUMENTS

| | | | |
|---|---|---|---|
| 2003660 | 3/1979 | United Kingdom | 427/250 |

OTHER PUBLICATIONS

IBM Technical Disclosure Bulletin, vol. 9, No. 3, Aug. 1966, "Coating of Through-Hole Dielectric Substrates," H. M. Haddad and H. K. Spannhake, p. 227.
IBM Technical Disclosure Bulletin, vol. 11, No. 10, Mar. 1969, "Screening of Land Patterns," L. P. Remsen, p. 1341.
IBM Technical Disclosure Bulletin, vol. 12, No. 10, Mar. 1970, "Producing Nonwettable Lands," S. A. Milkovich and L. F. Miller, p. 1657.
IBM Technical Disclosure Bulletin, vol. 15, No. 1, Jun. 1972, "Printed-Circuit Land," J. R. Cannizzaro, E. A. Holub, T. F. Moravansky and W. R. Park, p. 319.
The Proceedings of the 19th Electrical/Electronics Insulation Conference, Nov. 11-14, 1975, "Photosensitive Dry Film Solder Mask," R. N. Brummel and L. R. Wallig, pp. 15-18.
Proceedings of the First Printed Circuit World Convention, Jun. 5-8, 1978, "Experiences with Dry Film Solder Mask for P.C.B.'s" pp. 2.8.1-2.8.8, T. J. Hibbs.
Proceedings of the First Printed Circuit World Convention, Jun. 5-8, 1978, "Printed Wiring Design Aspects of Using Permanent Photopolymer (Dry Film Solder Mask) Coatings," J. J. Hickman, pp. 3.4.1-3.4.15.
Proceedings of the First Printed Circuit World Convention, Jun. 5-8, 1978, "Achieving Optimum Performance with UV Curable Solder Masks," F. Axon, R. Cleek, W. Custer, M. Lipson and D. Mestdagh, pp. 1.4.1-1.4.8.
Proceedings of the First Printed Circuit World Convention, Jun. 5-8, 1978, "Precision Solder Masks Using Liquid Photopolymer," R. Suender, pp. 1.5.1-1.5.7.
The Proceedings of the 19th Electrical/Electronics Insulation Conference, Nov. 11-14, 1975, "Using Ultraviolet Radiation Curable Resins for Printed Circuit Coatings," G. B. Fefferman, pp. 11-15.

*Primary Examiner*—John D. Smith
*Assistant Examiner*—Bernard F. Plantz
*Attorney, Agent, or Firm*—H. L. Newman

[57] ABSTRACT

A maskless process is disclosed for applying a patterned solder mask coating to a circuit board (31). In accordance with the process, there is applied to the surface (30) of the circuit board an uncured material (32) having a cure reaction which is susceptible to inhibition by the presence of oxygen. The surface of the circuit board is covered with the material to a first predetermined thickness. This first predetermined thickness of material on land areas (34) surrounding holes (36) in the circuit board is diminished to a second predetermined thickness by allowing a portion of the material on the land areas to flow into the holes. The uncured material is exposed to a first energy source which delivers a quantity of energy such that a surface layer (38) having the second predetermined thickness has its cure reaction substantially inhibited due to the presence of oxygen. Any uncured material in regions having the first predetermined thickness undergoes an advancement in cure reaction in a sublayer (37) beneath the cure-inhibited surface layer. Thereafter the cure-inhibited surface layer is removed from the circuit board with an appropriate solvent. The remaining material may be exposed advantageously to a second energy source to provide a further advancement in its cure reaction.

19 Claims, 5 Drawing Figures

MASKLESS PROCESS FOR APPLYING A PATTERNED SOLDER MASK COATING

This is a continuation of application Ser. No. 329,867, filed Dec. 11, 1981, now abandoned.

TECHNICAL FIELD

This invention relates to coating processes and, in particular, to a maskless process for defining and registering a solder mask coating on a printed circuit board.

BACKGROUND OF THE INVENTION

Over the years considerable effort has been expended in the development of processes for the manufacture of printed circuit boards. For example, F. M. Gillett et al, U.S. Pat. No. 2,965,952 issued Dec. 27, 1960 disclose a method for manufacturing etched circuitry. In accordance with this method a plurality of holes are punched through a sheet of dielectric material having relatively thin sheets of conductive material secured to each side. The sheet and annular surfaces of the holes are plated with a conductive material in order to establish electrical connections between the sheets of conductive material. The plated sheets are then coated with an adhesive. A portion of a pattern carried by a decalcomania is used to cover the holes such that the decalcomania overlies the sheet in an aligned manner. Thereafter the decalcomania is pressed into tight contact with the adhesive and the adhesive is allowed to dry. After a backing sheet is removed from the decalcomania and any excess adhesive is removed from the conductive sheets, the composite structure is exposed to an acid etching solution. This etchant removes any conductive material not covered by the adhesively-held decalcomania. When the decalcomania is removed, a printed circuit board having the desired pattern results.

Another illustration of the developing technology in the printed circuit board fabrication art is set forth in a disclosure entitled "Coating of Through-Hole Dielectric Substrates" by H. M. Haddad and H. K. Spannhake appearing in the IBM Technical Disclosure Bulletin, Vol. 9, No. 3, August 1966 at page 227. In this disclosure it is noted that three techniques are available for depositing thick, uniform coatings of photoresist material onto dielectric substrates having through-holes. The first technique is to fill the holes in the dielectric substrate with a water-soluble powder and after the photoresist is applied to dissolve the powder using ultrasonically agitated water. The second technique is to immerse the substrate in water, dry the water from the surface of the substrate, while allowing the holes to remain wetted, and then coating the substrate with hydrophobic photoresist material. The third technique consists of silk-screening the photoresist material through a patternless screen onto the substrate. The photoresist forced through the screen adheres to the substrate in all areas except above the hole areas.

A further illustration of the use of a screening process appears in a disclosure entitled "Screening of Land Patterns" by L. P. Remsen published in the IBM Technical Disclosure Bulletin, Vol. 11, No. 10, March 1969 at page 1341. In this disclosure it is noted that conductive land patterns on ceramic substrates can be formed by screening conductive paste through a screen having the selected pattern. With finer patterns there is a tendency towards voids in the end portion of the lands to which pads of a mounted semiconductor chip are to be joined. To overcome this problem, the mask is removed from the screen in those areas coinciding with the portions of the land patterns to which the pads are to be joined.

Further developments in the printed circuit manufacturing art are exhibited by a disclosure entitled "Producing Nonwettable Lands" by S. A. Milkovich and L. F. Miller appearing in the IBM Technical Disclosure Bulletin, Vol. 12, No. 10, March 1970 at page 1657. The disclosure indicates that a paste comprising powdered metals, dispersed in a binder, can be applied in a desired pattern to the surface of a glazed ceramic by methods such as screening or doctoring. The conductor pattern is fired at an elevated temperature to volatilize the binder to cause the powdered metals to adhere to the substrate. During the firing process, the glaze from the ceramic enters the conductor and acts as a shield to prevent wetting by molten metals, such as those encountered in dip-soldering.

More recent developments in the field are disclosed in B. C. Feng, U.S. Pat. No. 4,022,932 issued May 10, 1977. Feng relates to a resist reflow method for making submicron patterned resist masks. The mask is prepared initially using standard photo or electron beam lithography techniques to yield the smallest aperture dimensions consistent with the state-of-the-art. Then, the resulting mask is placed within a chamber containing an atmosphere of resist solvent vapor. The vapor is absorbed by the patterned resist mask causing controlled resist reflow which uniformly reduces the dimensions of the resist openings by an amount determined by time, temperature, resist thickness, resist type and solvent used.

In a United Kingdom patent application No. GB 2,003,660A published Mar. 14, 1979 there is disclosed a method for depositing an area of a material such as a metal on a substrate. The method includes the steps of defining a resist step on the substrate and then depositing a thickness of the material to provide a uniform coverage of the resist step. Thereafter, the material is unidirectionally etched to define the area as an abutment to the resist step. Finally, the resist is removed to leave the required area of material.

Further developments are illustrated by the disclosure of a flame retardant, flexible, solder resistant covercoat based on dichloropropyl acrylate in E. D. Feit, U.S. Pat. No. 4,136,225 issued Jan. 23, 1979.

A still more recent development, relating to a process for the production of solder masks for printed circuits, is disclosed in E. Losert et al, U.S. Pat. No. 4,230,793 issued Oct. 28, 1980. This process includes the steps of conveying the boards beneath a free falling curtain of a photopolymer to form a thin layer on a surface of the board. The layer is irradiated with ultraviolet light except for those areas of the surface layer that need to be soldered. The unirradiated areas of the layer are dissolved.

The above discussion serves to illustrate general developments in the art of printed circuit manufacture. At this point the discussion narrows to focus on the specific problem of applying solder masks to printed circuit boards.

A solder mask is a permanent coating applied to a printed circuit board after the conductors have been formed, but prior to the assembly operations of component insertion and attachment. Its purpose is to prevent molten solder from bridging conductors and pads during assembly soldering processes, and subsequently to provide a protective barrier against surface contamination during the circuit's operating life. The solder mask coating is typically applied in a pattern to cover all metallization except for those terminal pads that must remain bare to accept solder for component lead attachment, or to mate with connectors.

The two most common methods for patterning a solder mask coating on a printed circuit board are photoprinting and screen printing. The method used generally is determined by its cost and the resolution and registration accuracy required for the particular circuit. Resolution is a measure of detail delineation. In the case of solder mask the detail of interest is an opening in the coating having a predefined shape. Registration is a measure of the location deviation of the detail from the intended position.

In photoprinting, the entire printed circuit board surface is first completely coated. Virtually all production solder mask photoprinting operations use the solder mask in a dry film format as opposed to a liquid. It is purchased from the supplier already coated and dried (solvent has been removed) on a disposable polyester support sheet. The film of solder mask, as a thermoplastic solid, is applied to the printed circuit board by a lamination process. It is then selectively cured (cross-linked) in the desired pattern using ultraviolet radiation as the energy source. A photomask, containing transparent and opaque areas corresponding to the solder mask pattern, is interposed between the ultraviolet source and the uncured coating to produce selective area exposure. The unexposed, and therefore uncured, portions of the coating are removed by dissolving in a solvent that typically is sprayed onto the surface.

A more complete description of the photoprinting process using dry film solder masks can be found in the following articles: "Photosensitive Dry Film Solder Mask" by Roger N. Brummel and Lyle R. Wallig appearing in *The Proceedings of the 19th Electrical/Electronics Insulation Conference*, Nov. 11-14, 1975 at pages 15 through 18; "Experiences with Dry Film Solder Mask for P.C.B.'s" by T. J. Hibbs appearing in *Proceedings of the First Printed Circuit World Convention*, June 5-8, 1978 at pages 2.8.1 through 2.8.8; and "Printed Wiring Design Aspects of Using Permanent Photopolymer (Dry Film Solder Mask) Coatings" by J. J. Hickman appearing in *Proceedings of the First Printed Circuit World Convention*, June 5-8, 1978 at pages 3.4.1 through 3.4.15.

In screen printing, the solder mask, in an uncured (uncrosslinked) liquid state, is pushed with a moving squeegee blade through a screen mask onto the printed circuit board, which is positioned beneath and in close proximity to the screen. The screen has areas blocked off in a pattern corresponding to the areas on the printed circuit board that are not to be coated. The screen therefore acts as a stencil to allow transfer of the liquid in a predetermined pattern. The application and patterning are accomplished simultaneously.

Additional background information and details concerning the implementation of the screen printing process can be found in the following articles: "Achieving Optimum Performance with UV Curable Solder Masks" by F. Axon, R. Cleek, W. Custer, M. Lipson and D. Mestdagh appearing in *Proceedings of the First Printed Circuit World Convention*, June 5-8, 1978 at pages 1.4.1 through 1.4.8; "Precision Solder Masks Using Liquid Photopolymer" by R. Suender appearing in *Proceedings of the First Printed Circuit World Convention,* June 5-8, 1978 at pages 1.5.1 through 1.5.7; and "Using Ultraviolet Radiation Curable Resins for Printed Circuit Coatings " by G. B. Fefferman appearing in *The Proceedings of the 19th Electrical/Electronics Insulation Conference,* Nov. 11-14, 1975 at pages 11 through 15.

Screen printing is generally the faster and less expensive method, but it is not capable of producing the resolution and registration achievable with photoprinting. With printed circuit board designs moving in the direction of narrower spacing and denser conductor geometries, increasing use of photoprinting is taking place. However, the dry film material cost, and the critical nature of the photomask to printed circuit board registration step are major contributing factors to the high cost of using photoprinted solder mask.

Accordingly, the problem faced by the printed circuit industry is that of applying a solder mask coating to a circuit board by a method that is less costly than photoprinting yet achieves the resolution and registration provided by photoprinting.

SUMMARY OF THE INVENTION

The problem associated with the heretofore discussed disclosures is overcome in my process for applying a coating to a circuit board. The coating is applied so as to produce uncoated regions on land areas surrounding holes in the circuit board to which land areas an electrical connection is to be effected.

In accordance with my process there is applied to the surface of the circuit board an uncured material having a cure reaction which is susceptible to inhibition by the presence of oxygen. The surface of the circuit board is covered with the material to a first predetermined thickness. This first predetermined thickness of material on the land areas surrounding holes in the circuit board is diminished to a second predetermined thickness by allowing a portion of the material on the land areas to flow into the holes.

The uncured material is exposed to a first energy source which delivers a quantity of energy such that a surface layer having the second predetermined thickness has its cure reaction substantially inhibited due to the presence of oxygen. Any uncured material in regions having the first predetermined thickness undergoes an advancement in cure reaction in a sublayer beneath the cure-inhibited surface layer. Thereafter the cure-inhibited surface layer is removed from the circuit board with an appropriate solvent.

One additional aspect of the invention is that the amount of material flowing into the holes is preferably limited such that the thickness of material on sidewalls of the holes and the thickness of any material bridging the holes is no greater than the second predetermined thickness.

Another aspect of my process worthy of note is that following application of the uncured material, the circuit board and the uncured material covering the surface of the board can be heated advantageously thereby reducing the viscosity of the uncured material and increasing its flowability.

Yet another aspect of my process is that the uncured material can be applied advantageously by a screen printing process such that the applied coating is unpatterned. Other application techniques such as curtain coating, roller coating and spray coating can be employed advantageously to apply the uncured material to the surface of the circuit board.

BRIEF DESCRIPTION OF THE DRAWINGS

The aforementioned aspects of my invention, as well as other aspects, will be better understood upon consideration of the following detailed description and appended claims taken in conjunction with the attached drawings of an illustrative embodiment in which:

DETAILED DESCRIPTION

Figure 1:
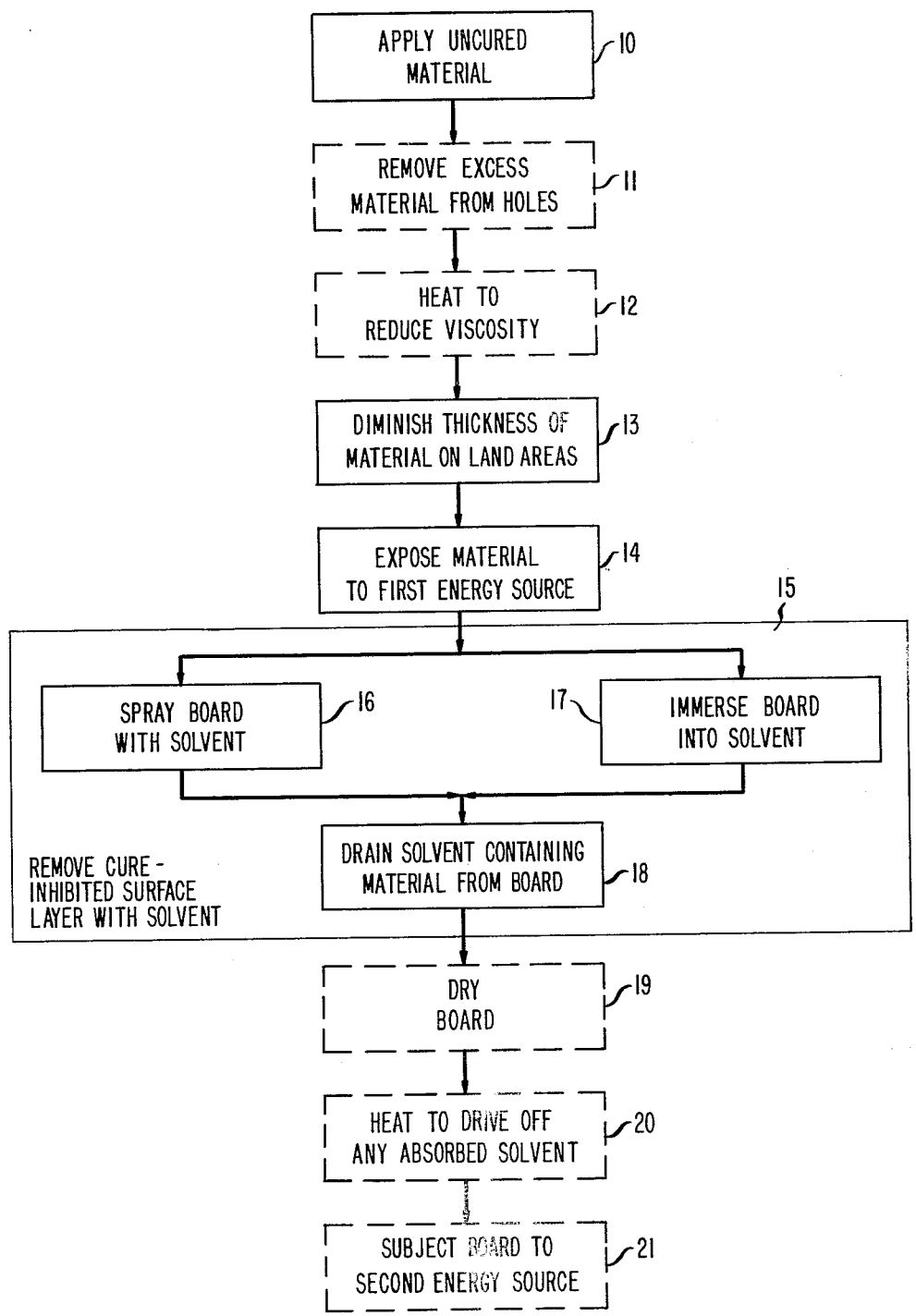
FIG. 1 is a block diagram illustrating the steps in the process with the optional steps indicated by blocks having broken outlines.

A block diagram illustrating the steps in my process appears as FIG. 1. In the diagram the major steps are set forth in boxes having solid outlines whereas the optional steps are set forth in boxes having broken outlines.

At the outset it should be noted that the objective to be achieved is that of applying a solder mask coating to a circuit board by a method that is less costly than photoprinting yet achieves the resolution and registration provided by photoprinting. To accomplish this end, I have developed a maskless process for applying a coating to a circuit board so as to produce uncoated regions in land areas surrounding holes in the circuit board. It is at such land areas that an electrical connection is to be effected. Typically, I have found that my process can be employed advantageously for hole sizes approximately 20 mils in diameter or greater. Smaller hole sizes than 20 mils typically make reduction of the thickness of the material on the land areas more difficult. Nevertheless, use of expedients such as use of suction, allows use of holes smaller than 20 mils.

Figure 2:
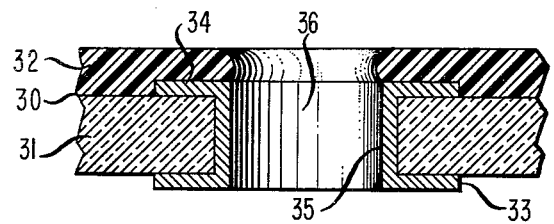
FIG. 2 is a partial sectional view of a plated-through hole in a circuit board showing the disposition of the uncured material after application to the board.

As illustrated in the partial sectional view of FIG. 2, the initial step in the process is the application to surface 30 of circuit board 31 uncured material 32. This step appears as block 10 in FIG. 1.

Material 32 is chosen so that upon treatment with a suitable source of energy, for example, ultraviolet light, infrared radiation, an electron beam or heat, it undergoes a modification, such as a chemical reaction, which renders it less susceptible to removal than from an unmodified region. For example, material 32 is chosen which upon irradiation undergoes a chemical reaction such as polymerization through crosslinking and becomes relatively insoluble in a solvent that rapidly dissolves the unreacted material.

Material 32 is preferably an ultraviolet radiation curable liquid having a cure reaction which is susceptible to inhibition by the presence of oxygen, the degree of inhibition being such as to permit material 32 to remain as a flowable liquid upon exposure to an appropriate first energy source. However, electron beam or thermally curable liquids having the inhibition characteristic are also suitable for this purpose.

Surface 30 should be covered with material 32 to a first thickness which is on the order of twice the thickness of metallized layer 33 constituting land area 34 and sidewalls 35 of plated-through hole 36. Metallized layer 33 typically falls within a thickness range of approximately one to five mils. Accordingly, surface 30 would be covered by uncured material 32 to a thickness ranging between 2.5 mils and eight mils.

Several different techniques may be employed to apply uncured material 32 to surface 30. One technique that has proved to be extremely effective is that of screen printing with the screen not having any pattern therein. Another technique that is suitable for this purpose is a curtain coating process. Other ways that material 32 can be applied to surface 30 are roller coating, spray coating and by the use of a threaded draw-down bar.

Depending on the thickness of material 32 applied to surface 30 and, in particular, whether plated-through hole 36 receives so much material 32 as to become plugged, it may be necessary to implement the optional step signified by block 11 in FIG. 1. This step calls for the removal of at least a portion of any uncured material 32 resident in hole 36 so as to provide a cavity to accept further uncured material 32 flowing from land area 34 upon implementation of a subsequent step. In practice this step is most easily implemented by the application of suction to the underside of circuit board 31.

Figure 3:
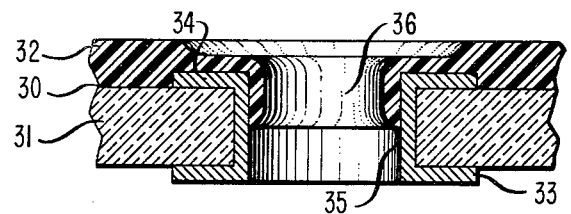
FIG. 3 is a partial sectional view of the hole after the thickness of material on the land area surrounding the hole is diminished.

After circuit board 31 has material 32 applied thereto the next step is to diminish the amount of material 32 on land areas 34. This step appears as block 13 in the block diagram of FIG. 1. The reduction in thickness of material 32 is accomplished by allowing a portion of material 32 on land areas 34 to flow into plated-through holes 36, as shown in FIG. 3. The amount of material 32 flowing into holes 36 is preferably limited such that the thickness of material 32 on sidewalls 35 and any material 32 which might bridge holes 36 is no greater than the thickness of material 32 which will remain uncured by oxygen inhibition. This thickness of material 32 which will remain uncured typically ranges in thickness from approximately one-half to two mils.

Although the thickness of uncured material 32 on land areas 34 is diminished due to the presence of holes 36, if material 32 is excessively viscous, that is, has a viscosity greater than approximately 10,000 centipoise, or if holes 36 are unusually small, that is, having a diameter less than approximately 20 mils, it is possible that excessive time periods for thickness diminution will occur.

In order to reduce the amount of time required for the diminution of material 32 on land areas 34, an optional step denoted as block 12 in FIG. 1, can be employed advantageously. This optional step involves the heating of circuit board 31 and material 32 covering surface 30 such that the viscosity of material 32 is reduced thereby increasing its flowability. In contrast, if material 32 is too thin, that is, a viscosity less than approximately 100 centipoise, generally coating of material 32 on circuit board 31 is difficult.

Having diminished the thickness of material 32 on land areas 34 to a thickness no greater than the thickness of a layer which will remain uncured due to oxygen inhibition, the next step is to expose material 32 to a source of energy (not shown) to initiate the cure reaction. This step is denoted as block 14 in FIG. 1. The type of energy source that is employed is dependent upon the type of material 32 that is used. For instance, if material 32 is an ultraviolet curable substance the energy source is either an ultraviolet radiation source or an electron beam source. If material 32 is a thermally curable substance, the energy source is a heat source.

Figure 4:
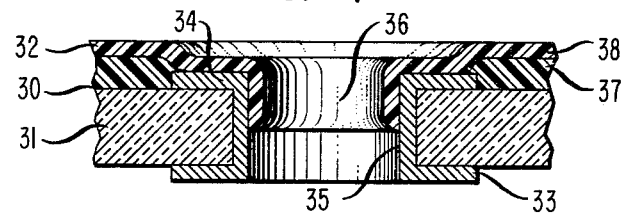
FIG. 4 is a partial sectional view of the hole after exposure of the uncured material to a first energy source which causes an advancement in cure reaction in a sublayer beneath the cure-inhibited surface layer.

Whichever type of material 32 and energy source that is employed, material 32 is exposed to such source for a time sufficient to cause an advancement in its cure reaction in sublayer 37, as shown in FIG. 4, while surface layer 38 remains uncured due to oxygen inhibition. The amount of oxygen in ambient air is sufficient to cause such inhibition.

Not only the environment but also the dose of the exposure from the first energy source and the intensity of the energy influence the degree of inhibition. The dose, that is, the total energy supplied per unit volume, should be adequate to produce sufficient advancement in cure in sublayer 37. For example, for material undergoing free-radical polymerization, such as acrylates, actinic doses in the range of 20 to 2000 millijoules per square centimeter are typically employed.

Excessive intensity generally counteracts the inhibiting effect of the environment. For example, actinic intensities greater than 100 milliwatts per square centimeter generally produce free radicals in surface layer 38 at a rate faster than oxygen in air reacts with these radicals to inhibit the reaction. Thus, to increase the extent of inhibition either the intensity is reduced or the oxygen concentration in the environment is increased. However, for modifications such as free-radical reactions in materials such as some acrylates, intensities less than one milliwatt per square centimeter result in excessively long and thus uneconomical exposure periods. For such materials to achieve the desired level of inhibition and still receive the desired dose level in a nominal time, intensities in the range of two to twenty milliwatts per square centimeter are employed. As discussed, a suitable concentration of oxygen in the environment will inhibit the modification of surface layer 38 for materials 32 that undergo free-radical reactions. The extent of inhibition can be increased advantageously by increasing the concentration of oxygen in the environment. Such increase in oxygen concentration is useful if greater intensities are desired.

Following exposure, uncured surface layer 38 is removed with a solvent. The cured sublayer 37 should not exhibit any blistering, wrinkling, delamination or other similar defects from surface 30 of circuit board 31. As was the case with the choice of energy source, the choice of solvent is dependent upon the type of material 32 that is employed. For some acrylated epoxy based materials 32, solvents such as 1,1,1-trichloroethane and diethylene glycol monobutyl ether have been used advantageously. However, other solvents may be used successfully.

The removal of uncured surface layer 38 can be effected in one of two ways as shown in FIG. 1 by block 15. In accordance with the first method, the solvent is sprayed onto board 31. This is denoted as block 16 in FIG. 1. In accordance with the second method, board 31 is immersed into the solvent. This is denoted as block 17 in FIG. 1. Regardless of which method is used, the cure-inhibited material is removed from board 31 and any remaining solvent is allowed to drain. This step appears as block 18 in FIG. 1.

Figure 5:
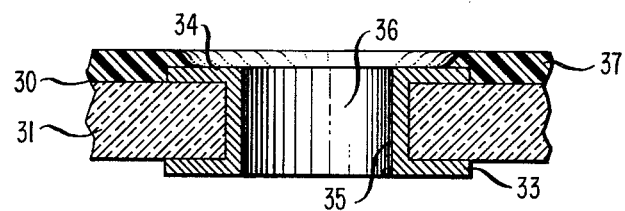
FIG. 5 is a partial sectional view of the hole after the cure-inhibited surface layer has been removed by an appropriate solvent.

Once uncured surface layer 38 is removed and excess solvent is drained from board 31, as shown in FIG. 5, board 31 is dried. As denoted by block 19 in FIG. 1, this drying step is optional. Following the drying operation, board 31 is heated for a time sufficient to drive off any solvent absorbed into uncovered sublayer 37. Thereafter sublayer 37 is preferably subjected to a second energy source to further advance the cure reaction to what might be considered the final state at which time sublayer 37 has a thickness ranging between approximately two and six mils. Note once again that the heating operation and exposure to the second energy source are optional steps as denoted by blocks 20 and 21 in FIG. 1.

The second energy source should be capable of delivering a quantity of energy which is somewhat greater than that delivered by the first source. Moreover, the second source like the first source depends upon the type of substance constituting material 32, that is, whether it is an ultraviolet curable material, electron beam curable material or a thermally curable material. Depending upon the choice of material, the second energy source can be an ultraviolet radiation source, an electron beam source, a heat source or certain selected combinations thereof.

In a first specific embodiment of my method, uncured material 32 was a solder mask material SM-15-BTL manufactured by Dynachem Corporation. This material 32 was screen printed through a 135 mesh polyester screen having perimeter definition only. Uncured material 32 was applied to a thickness of 2.5 mils. Thereafter coated circuit board 31 was heated by a Gyrex Microdryer Model 92 heat source with the preheat setting at "Hi" and the main heat setting at "5". One pass was made with the conveyer speed set at five feet per minute. As a result of this heating step, the thickness of material 32 on land areas 34 was diminished to less than one mil. Circuit board 31 was then exposed to a 1,000 watt high pressure mercury vapor lamp focused over a 12 inch diameter circle. The exposure was for a period of five seconds. The cure-inhibited surface layer 38 was removed by immersing circuit board 31 in a 1,1,1-trichloroethane solvent for 30 seconds. Circuit board 31 was dried by compressed air. Following the drying step, circuit board 31 was heated in a forced air oven for ten minutes at a temperature of 100° C. This heating step was employed to drive off any solvent which may have been absorbed. Circuit board 31 then was exposed to two focused linear 200 watt per inch medium pressure mercury vapor lamps. One pass was made under the lamps at a rate of ten feet per minute. In this embodiment of my process the resulting uncoated region surrounding hole 36 was an annular ring concentric with hole 36, having an internal radius equal to the hole radius and an external radius eight mils greater than the radius of hole 36.

A second illlustrative embodiment of my process employed the same uncured material 32 as in the first embodiment. However, in this case uncured material 32 was applied to circuit board 31 by screen printing through a 60 mesh polyester screen having perimeter definition only. Uncured material 32 was applied to a thickness of five mils. Any excess material in holes 36 was blown out by positive air pressure applied from the noncoated side of circuit board 31. Circuit board 31 was heated to reduce the viscosity of uncured material 32. The same heat source described above for the first embodiment was employed in this embodiment of the process. However, two passes were made with the conveyer speed set at five feet per minute. As a result of this heating step, the thickness of uncured material 32 on land areas 34 was diminished to less then 1.5 mils. Circuit board 31 then was exposed to a 1,000 watt high pressure mercury vapor lamp focused over a 12 inch diameter circle for a period of five seconds. The cure-inhibited surface layer 38 was removed from circuit board 31 by immersing circuit board 31 in a 1,1,1-trichloroethane solvent for a period of 30 seconds. In this embodiment of the process, the optional drying step was omitted. Following the removal of cure-inhibited surface layer 38, circuit board 31 was heated in a forced air oven for ten minutes at 100° C. After the heating step, circuit board 31 was exposed to two focused linear 200 watt per inch medium pressure mercury vapor lamps with one pass being made at a speed of ten feet per minute. In this embodiment of my process, the resulting uncoated region surrounding hole 36 was an annular ring concentric with hole 36, having an internal radius equal to the hole radius and an external radius four mils greater than the radius of hole 36.

In a third embodiment of the process uncured material 32 was the same as that used in the first embodiment. However, in this embodiment, material 32 was applied to a thickness of 2.5 mils with a manually operated draw-down bar having 56 threads per inch. Any excess material 32 entering holes 36 was drawn out by a vacuum from the noncoated side of circuit board 31. The viscosity of uncured material 32 was reduced by subjecting circuit board 31 to the same heat source previously described in the first embodiment. However, two passes were made through the heat source at a speed of five feet per minute. The thickness of uncured material 32 on land areas 34 was diminished to less than one mil. Thereafter, circuit board 31 was exposed to two focused linear 120 watt per inch medium pressure mercury vapor lamps with a 55 percent transmission filter interposed between the lamps and circuit board 31. One pass was made at a speed of ten feet per minute. Cure-inhibited surface layer 38 was removed by immersing circuit board 31 in a 1,1,1-trichloroethane solvent for a period of 30 seconds. Following immersion, circuit board 31 was dried by compressed air. Circuit board 31 was subsequently heated in a forced air oven for a period of ten minutes at 100° C. The final operation on circuit board 31 was exposure to two focused linear 200 watt per inch medium pressure mercury vapor lamps with one pass being made at a speed of ten feet per minute. In this embodiment of my process, the uncoated region had an external radius four mils greater than the radius of hole 36.

In yet a fourth embodiment of my method, the same uncured material 32 used in the previous three embodiments was employed. In this embodiment, uncured material 32 was applied to a thickness of 4.5 mils by screen printing through an 83 mesh polyester screen having perimeter definition plus ten mil spots. These spots were centered over 43 mil diameter holes 36. Due to the presence of the ten mil spots in the screen, it was not necessary to remove any excess material 32 from holes 36, since the spots prevent the application of material 32 to board 31 in a quantity sufficient to plug holes 36. Thereafter, circuit board 31 was heated to reduce the viscosity of uncured material 32. This heating was accomplished by exposure to an infrared dryer for a period of two minutes at which time the surface temperature of circuit board 31 reached 100° C. As a result of the heating step, the thickness of material 32 on land areas 34 was diminished to a thickness of less than 1.5 mils. Circuit board 31 then was exposed to a PC-30 exposure unit manufactured by E. I. DuPont de Nemours & Company. This unit was set for 300 units of energy and the duration of the exposure was 75 seconds. Cure-inhibited surface layer 38 was removed by spraying a 1,1,1-trichloroethane solvent on circuit board 31. This spraying was done in a "C" processor developing unit, manufactured by E. I. DuPont de Nemours & Company, at a rate of 4.8 meters per minute. In this embodiment, the optional drying step was omitted. After cure-inhibited surface layer 38 was removed, circuit board 31 was heated in a forced air oven for a period of ten minutes at a temperature of 110° C. Circuit board 31 was then exposed to three focused linear 200 watt per inch medium pressure mercury vapor lamps with one pass being made at a speed of 13 feet per minute. In this embodiment of my process the uncoated region had an external radius seven mils greater than the radius of hole 36.

In a fifth embodiment of my method, uncured material 32 contained the following ingredients in the amounts shown below. Material 32 for this embodiment will be hereinafter referred to as Formulation A.

| FORMULATION A | |
|---|---|
| Ingredient | Amount by unit weight |
| Celrad ® 3700 | 30 |
| Hycar ® VTBN 1300X22 | 20 |
| SR-349 | 30 |
| QM-589 | 40 |
| Irgacure 651 | 1 |
| Magenta pigment conc. #9R75 | 3 |

Celrad 3700 obtained from Celanese Plastics and Specialties Company essentially consists of an acrylated epoxy prepared by reacting acrylic acid with a bisphenol A epoxy resin having an epoxy equivalent weight of 190-200. Hycar VTBN 1300X22, sold by the B. F. Goodrich Chemical Group, essentially consists of an acrylate terminated acrylonitrile butadiene liquid rubber having a molecular weight of approximately 3500, with an acrylonitrile content of approximately 17 percent and an acrylate content of approximately 1.85 per molecule. SR-349, obtained from Sartomer Company, essentially consists of an ethoxylated bis-phenol A diacrylate. QM-589, available from the Rohm and Haas Company, essentially consists of isobornyl acrylate. Irgacure 651 is a photoinitiator from the Ciba-Geigy Corporation having the chemical name 2,2-dimethoxy phenyl acetophenone. Magenta pigment concentrate #9R75, obtained from Penn Color, Inc., contains a quinacridone type pigment dispersed in trimethylolpropane triacrylate.

Formulation A is prepared as follows: In a common vessel is added the above ingredients in the amounts shown above and in the order listed. The vessel was heated to approximately 50—50 degrees centigrade by means of a water bath. The mixture was then stirred for 10-15 minutes at that temperature by means of a mechanical stirrer. The mixture was then cooled to room temperature and allowed to stand for eight hours before using to allow entrapped air bubbles to escape. Alternatively, the cooled mixture was placed in a vacuum chamber at 10-20 mm mercury pressure for five minutes to remove the entrapped air bubbles.

Formulation A was applied to circuit board 31 to a thickness of 3.2 mils by a manually operated draw-down bar having 40 threads per inch. Any excess material 32 in holes 36 was drawn out by a vacuum from the noncoated side of circuit board 31. Thereafter circuit board 31 was heated by exposure to the same heat source described above with respect to the first embodiment, however, the conveyer speed was set at 2½ feet per minute and one pass was made. This heating step diminished the thickness of uncured material 32 on land areas 34 to less than 1.2 mils. Circuit board 31 was then exposed for 20 seconds to a 1,000 watt high pressure mercury vapor lamp focused over a 12 inch diameter surface. Cure-inhibited surface layer 38 was removed by immersion in diethylene glycol monobutyl ether for a period of three minutes. Circuit board 31 was dried by compressed air. Thereafter, circuit board 31 was heated in a forced air oven for a period of 30 minutes at 100° C. Finally, circuit board 31 was exposed to two focused linear 200 watt per inch medium pressure mercury vapor lamps with two passes being made at a speed of ten feet per minute. In this embodiment of any process, the uncoated region had an external radius seven mils greater than the radius of hole 36.

In a sixth embodiment of my method, uncured material 32 consists of the following ingredients in the amounts shown below. Material 32 for this embodiment will be hereinafter referred to as Formulation B.

| FORMULATION B | |
| --- | --- |
| Ingredient | Amount by unit weight |
| Celrad ® 3702 | 50 |
| Hycar ® VTBN 1300X23 | 30 |
| QM-589 | 50 |
| 2,2-diethoxyacetophenone | 4 |
| Magenta pigment conc. #9R75 | 3 |
| Modaflow ® | 1 |

Celrad 3702, from Celanese Plastics and Specialties Company, essentially consists of an acrylate derived from reacting bis-phenol A epoxide with acrylic acid and an unknown diacid. Hycar VTBN 1300X23 from B. F. Goodrich Chemical Group, is structurally similar to Hycar VTBN 1300X22 but having approximately 2.35 acrylate groups per molecule. The photoinitiator is 2,2-diethoxyacetophenone from Polysciences, Inc. Modaflow is a flow modifier obtained from the Monsanto Industrial Chemicals Company.

Formulation B was prepared in the same manner as Formulation A. That is, the ingredients were added to a common vessel in the order and amounts shown above, heated to 50–60 degrees contigrade and stirred with a mechanical stirrer for 15 minutes. Entrapped air bubbles were removed by allowing the mixture to stand at room temperature for eight hours before use or by holding under vacuum for five minutes at 10–20 mm mercury pressure.

Formulation B was applied to circuit board 31 to a thickness of six mils by a manually operated draw-down bar having 18 threads per inch. Any excess material 32 in holes 36 was drawn out by a vacuum from the non-coated side of circuit board 31. Thereafter, circuit board 31 was heated by exposure to the same heat source described above with respect to the first embodiment, however, the conveyer speed was set at 2½ feet per minute and one pass was made. This heating step diminished the thickness of uncured material 32 on land areas 34 to less than 1.5 mils. Circuit board 31 was then exposed for 40 seconds to a 1,000 watt high pressure mercury vapor lamp focused over a 12 inch diameter surface. Cure-inhibited surface layer 38 was removed by sraying diethylene glycol monobutyl ether on circuit board 31 for a period of three minutes. The optional drying step was omitted. Circuit board 31 was heated in a forced air oven for a period of 30 minutes at 100° C. Finally, circuit board 31 was exposed to two focused linear 200 watt per inch medium pressure mercury vapor lamps with two passes being made at a speed of ten feet per minute. In this embodiment of my process, the uncoated region surrounding hole 36 had an external radius six mils greater than the radius of hole 36.

In a seventh embodiment of my process, Formulation B was applied to circuit board 31 to a thickness of 3.3 mils by a KMC Corporation Model M-CC-H-1-22 curtain coater operating at a belt speed of 300 feet per minute. In this embodiment, it was unnecessary to remove excess material from holes 36 since no excess material entered the holes. In addition, it was not necessary to heat circuit board 31 to reduce the viscosity of material 32 since material 32 surrounding holes 36 is sufficiently diminished by virtue of the curtain coating application. The material thickness surrounding holes 36 was less than 1.5 mils. Circuit board 31 then was exposed for 20 seconds to a 1,000 watt high pressure mercury vapor lamp focused over a 12 inch diameter surface. Cure-inhibited surface layer 38 was removed by immersion in diethylene glycol monobutyl ether for a period of three minutes. Circuit board 31 was dried by compressed air and thereafter was heated in a forced air oven for a period of 30 minutes at 100° C. Finally, circuit board 31 was exposed to two focused linear 200 watt per inch medium pressure mercury vapor lamps with two passes being made at a speed of ten feet per minute. In this embodiment of my process, the uncoated region surrounding hole 36 had an external radius seven mils greater than the radius of hole 36.

In all cases it is to be understood that the above-described embodiments are illustrative of but a small number of many possible specific embodiments which can represent applications of the principles of the invention. Thus, numerous and various other embodiments can be devised readily in accordance with these principles by those skilled in the art without departing from the spirit and scope of the invention.

What is claimed is:

1. A process for applying a coating to a circuit board so as to produce uncoated regions on land areas surrounding holes in said circuit board to which land areas an electrical connection is to be effected, said process CHARACTERIZED IN THAT it includes the steps of:

applying to the surface of said circuit board an uncured material having a cure reaction which is susceptible to inhibition by the presence of oxygen, said surface being covered with said material to a first predetermined thickness;

diminishing said first predetermined thickness of said material on said land areas surrounding said holes to a second predetermined thickness by allowing a portion of said material on said land areas to flow into said holes;

exposing said uncured material to a first energy source, which delivers a quantity of energy such that a surface layer having said second predetermined thickness has its cure reaction substantially inhibited due to the presence of oxygen whereas any uncured material in regions having said first predetermined thickness undergoes an advancement in cure reaction in a sublayer beneath the cure-inhibited surface layer; and removing said cure-inhibited surface layer from said circuit board with an appropriate solvent.

2. The process in accordance with claim 1 wherein the amount of material flowing into said holes is preferably limited such that the thickness of said material on sidewalls of said holes and the thickness of any said material bridging said holes is no greater than said second predetermined thickness.

3. The process in accordance with claim 2 wherein said removing step comprises the steps of spraying said circuit board including said sidewalls of said holes with said solvent for a time sufficient to remove said cure-inhibited surface layer of said material;

draining any remaining solvent from said circuit board; and drying said circuit board.

4. The process in accordance with claim 2 wherein said removing step comprises the steps of immersing said circuit board including said sidewalls of said holes into said solvent for a time sufficient to remove said cure-inhibited surface layer of said material;

draining any remaining solvent from said circuit board; and drying said circuit board.

5. The process in accordance with claim 1 wherein following said applying step said process further includes the step of heating said circuit board and said uncured material covering said surface of said board to reduce the viscosity of said material thereby increasing the flowability of said material.

6. The process in accordance with claim 1 wherein said applying step is implemented by screen printing such that the applied coating is unpatterned.

7. The process in accordance with claim 1 wherein said applying step is implemented by a curtain coating process.

8. The process in accordance with claim 1 wherein said applying step is implemented by a roller coating process.

9. The process in accordance with claim 1 wherein said applying step is implemented by a spray coating process.

10. The proces in accordance with claim 1 wherein said applying step is implemented by a threaded drawdown bar.

11. The process in accordance with claim 1 wherein said uncured material is an ultraviolet radiation curable liquid.

12. The process in accordance with claim 1 wherein said uncured material is a thermally curable liquid.

13. The process in accordance with claim 1 wherein said uncured material is an electron beam curable liquid.

14. The process in accordance with claim 1 wherein following said removing step said process further includes the step of subjecting said sublayer, remaining after removal of said cure-inhibited surface layer, to a second energy source, said second energy source delivering a quantity of energy relatively greater than said quantity of energy delivered by said first energy source thereby advancing said cure reaction of said material at an accelerated rate.

15. The process in accordance with claim 14 wherein following said removing step but before said subjecting step said process further includes the step of heating said sublayer, remaining after removal of said cure-inhibited surface layer, for a time sufficient to drive off any solvent absorbed into said remaining sublayer during the removal of said cure-inhibited surface layer.

16. The process in accordance with claim 15 wherein said first energy source is either an ultraviolet radiation source, an electron beam source or a heat source and said second energy source is either an ultraviolet radiation source, an electron beam source or a heat source.

17. The process in accordance with claim 1 wherein after the applying step but before the diminishing step the process further includes the step of removing a portion of any uncured material resident in said holes in said circuit board as a result of said applying step so as to provide a cavity to accept uncured material flowing from said land areas as a result of said diminishing step.

18. A process for applying a coating to a circuit board so as to produce uncoated regions on a land area to which an electrical connection is to be effected, said process CHARACTERIZED IN THAT it includes the steps of:

applying to the surface of said circuit board an uncured material having a cure reaction which is susceptible to inhibition by the presence of oxygen, said surface being covered with said material to a first predetermined thickness;

diminishing said first predetermined thickness of said material on said land area to a second predetermined thickness by allowing a portion of said material on said land area to flow away from said land area;

exposing said uncured material to a first energy source, which delivers a quantity of energy such that a surface layer having said second predetermined thickness has its cure reaction substantially inhibited due to the presence of oxygen whereas any uncured material in regions having said first predetermined thickness undergoes an advancement in cure reaction in a sublayer beneath the cure-inhibited surface layer; and removing said cure-inhibited surface layer from said circuit board with an appropriate solvent.

19. A process for applying a coating to a surface so as to produce uncoated regions on a particular area of said surface, said process CHARACTERIZED IN THAT it includes the steps of:

applying to said surface an uncured material having a cure reaction which is susceptible to inhibition by the presence of oxygen, said surface being covered with said material to a first predetermined thickness;

diminishing said first predetermined thickness of said material on said particular area to a second predetermined thickness;

exposing said uncured material to a first energy source, which delivers a quantity of energy such that a surface layer having said second predetermined thickness has its cure reaction substantially inhibited due to the presence of oxygen whereas any uncured material in regions having said first predetermined thickness undergoes an advancement in cure reaction in a sublayer beneath the cure-inhibited surface layer; and removing said cure-inhibited surface layer from said surface with an appropriate solvent.

* * * * *

UNITED STATES PATENT AND TRADEMARK OFFICE
CERTIFICATE OF CORRECTION

PATENT NO. : 4,459,320

DATED : July 10, 1984

INVENTOR(S) : Gerald B. Fefferman

It is certified that error appears in the above—identified patent and that said Letters Patent is hereby corrected as shown below:

Column 10, line 56, "50-50" should read --50-60--. Column 11, line 18, "any" should read --my--; line 48, "contigrade" should read --centigrade--; line 68, "sraying" should read --spraying--. Column 12, line 12, "M-CC-H-1-22" should read --KM-CC-H-1-22--.

Signed and Sealed this

Thirtieth Day of April 1985

[SEAL]

Attest:

DONALD J. QUIGG

Attesting Officer     Acting Commissioner of Patents and Trademarks